(12) United States Patent
Kitajima

(10) Patent No.: US 7,498,855 B2
(45) Date of Patent: Mar. 3, 2009

(54) POWER-ON CLEAR CIRCUIT

(75) Inventor: Hiroyuki Kitajima, Shiga (JP)

(73) Assignee: NEC Electronics Corporation, Kanagawa (JP)

( * ) Notice: Subject to any disclaimer, the term of this patent is extended or adjusted under 35 U.S.C. 154(b) by 133 days.

(21) Appl. No.: 11/193,470

(22) Filed: Aug. 1, 2005

(65) Prior Publication Data

US 2006/0022725 A1    Feb. 2, 2006

(30) Foreign Application Priority Data

Jul. 30, 2004  (JP)  ............................ 2004-222678

(51) Int. Cl.
*H03K 3/02*  (2006.01)
*H03L 7/00*  (2006.01)

(52) U.S. Cl. .................. 327/143; 327/198; 327/541

(58) Field of Classification Search ............ 327/57, 327/198, 142, 143, 538, 540, 541, 543
See application file for complete search history.

(56) References Cited

U.S. PATENT DOCUMENTS 5,850,156 A * 12/1998 Wittman .................. 327/143
6,259,284 B1 * 7/2001 Hwang et al. ............ 327/142
6,982,577 B2 * 1/2006 Sekino et al. ............ 327/143

FOREIGN PATENT DOCUMENTS

JP    2002271185 A  *  9/2002
JP    2003-8426          10/2003

* cited by examiner

Primary Examiner—Quan Tra
Assistant Examiner—Colleen O'Toole
(74) Attorney, Agent, or Firm—Young & Thompson

(57) ABSTRACT

A power-ON-clear circuit has a reset period when the power supply stops temporarily (or instantaneously) and then that power supply is restored. The power-ON-clear circuit 30 of a semiconductor integrated circuit 200 comprises: a capacitor C31 of which one end is connected to the external power-supply voltage Vcc1; an N-channel MOS transistor Q31 of which the drain is connected to the other end of the capacitor C31, the source is connected to the ground potential, and the gate is connected to the external power-supply voltage by way of a resistor R31; and an inverter INV31 that is connected to the connecting point between the capacitor C31 and MOS transistor Q31 in a stage connection, and is connected to the power supply between the internal power-supply voltage Vcc2 and the ground potential.

6 Claims, 4 Drawing Sheets

# POWER-ON CLEAR CIRCUIT

FIELD OF THE INVENTION

The present invention relates to a semiconductor integrated circuit containing a voltage regulator and power-ON-clear circuit (also called a power-ON-reset circuit), and more particularly to a semiconductor integrated circuit that generates a reset signal from the power-ON-clear circuit in response to the output level of the voltage regulator.

BACKGROUND OF THE INVENTION

In a semiconductor integrated circuit in which sequential logic circuits, such as flip-flop circuits, or registers, counters or the like having flip-flop circuits as the basic configuration, are used in the internal circuits, there is a fear of malfunction due to unsteady levels when the power is turned ON, so generally, the semiconductor integrated circuit contains a power-ON-clear circuit (for example, refer to Patent Document 1). By having this power-ON-clear circuit operate when the power is turned ON in order to reset or initialize the internal circuits, it is possible to prevent the semiconductor integrated circuit from malfunctioning.

A conventional power-ON-clear circuit will be explained below with reference to FIG. 5. The power-ON-clear circuit 10 comprises a resistor R11, capacitors C11, C12, N-channel MOS transistor Q11 and inverter INV11. The resistor R11 and capacitor C11 are connected in series between the power-supply voltage Vcc and the ground potential Gnd. The capacitor C12 and transistor Q11 are connected in series between the power-supply voltage Vcc and the ground potential Gnd, and the gate of the transistor Q11 is connected to the connecting point, or in other words, the node ND11 between the resistor R11 and capacitor C11. The input terminal of the inverter INV11 is connected to the connecting point, or in other words, the node ND12 between the capacitor C12 and the drain of the transistor Q11. The output signal from the inverter INV11 is output as a reset signal RES to the internal circuits (not shown in the figure) that are connected in a later stage.

In a power-ON-clear circuit 10 that is constructed in this way, after the power-supply voltage Vcc begins to be supplied, first, the node ND12 is pulled up by the capacitor C12 and maintained at nearly the power-supply voltage Vcc. At this time, the reset signal RES from the inverter INV11 is maintained at low level. The capacitor C11 is charged via the resistor R11, so the gate voltage of the transistor Q11 rises gradually, and when it reaches the threshold voltage of the transistor Q11, the transistor Q11 changes to the conductive state. In response to this, the node ND12 changes from high level to low level. Also, the reset signal RES from the inverter INV11 changes from low level to high level. When the reset signal RES is low level, the internal circuits that are connected in a later stage are reset, and when the reset signal RES becomes high level, the reset state is cleared.

Next, a semiconductor integrated circuit 100 that contains the power-ON-clear circuit 10 described above will be explained with reference to FIG. 6. In this semiconductor integrated circuit 100, when an internal circuit that is reset or initialized by the power-ON-clear circuit 10 comprises a transistor having a low breakdown voltage, and when the external power-supply voltage Vcc1 equals or is greater than that breakdown voltage, the output level of the power-ON-clear circuit 10 must be set to a voltage level that corresponds to the breakdown voltage of this transistor and that is lower than the external power-supply voltage Vcc1. As a means for accomplishing this, the semiconductor integrated circuit 100 contains a voltage regulator 20 that regulates the external power-supply voltage Vcc1 to an internal power-supply voltage Vcc2.

The voltage regulator 20 comprises an output P-channel MOS transistor Q21, a differential amplifier 21, a voltage-dividing circuit 22 comprising voltage-dividing resistors R21, R22, and a reference-voltage source 23. The MOS transistor Q21 and voltage-dividing circuit 22 are connected in series between the external power-supply voltage Vcc1 and ground potential Gnd, and the serial connecting point between them, or in other words, node ND21, is the output terminal of the internal power-supply voltage Vcc2. The serial connecting point between the voltage-dividing resistors R21, R22, or in other words, node ND22, is connected to the non-inverting input terminal of the differential amplifier 21. A reference-voltage supply 23 is connected to the inverting input terminal of the differential amplifier 21. The output terminal of the differential amplifier 21 is connected to the gate of the MOS transistor Q21. An ESD (Electro Static Discharge) protection diode D21 is connected between the external power-supply voltage Vcc1 and node ND21, and an ESD protection diode D22 is connected between node ND21 and the ground potential Gnd. Also, an external smoothing capacitor C1 is connected between node ND21 and the ground potential Gnd.

In the semiconductor integrated circuit 100, when the external power-supply voltage Vcc1, for example, Vcc1=3V is supplied to the voltage regulator 20, the voltage regulator 20 generates an internal power-supply voltage Vcc2, for example, Vcc2=2V, and this internal power-supply voltage Vcc2 is supplied from the voltage regulator 20 to the power-ON-clear circuit 10 instead of the external power-supply voltage Vcc1. At this time, as shown in FIG. 7, in the power-ON-clear circuit 10, there is a period (reset period) from time T1 to time T2 when the reset signal RES is low level.

[Patent Document 1]
Japanese Patent Kokai Publication No. JP-P2003-8426A (see FIG. 5)

SUMMARY OF THE DISCLOSURE

However, in a semiconductor integrated circuit in which flip-flop circuits or sequential-logic circuits are used as the internal circuits, when the supply of the power-supply voltage to the internal circuits is stopped due to a temporary (or instantaneous) stoppage of the supply of the external power-supply voltage because of some cause such as exchanging batteries or disconnecting the power-supply line, in order to prevent malfunction of the semiconductor integrated circuit when restoring the supply of the external power-supply voltage, it is necessary to reset or initialize the internal circuit using the power-ON-clear circuit.

The operation of the power-ON-clear circuit 10 when the supply of the external power-supply voltage Vcc1 in the semiconductor integrated circuit 100 is temporarily (or instantaneously) stopped and then restored is explained below with reference to FIG. 7. After the external power-supply voltage Vcc1=3V that is supplied to the semiconductor integrated circuit stops at time T3 and that voltage becomes Vcc1=0V, the internal power-supply voltage Vcc2 (potential at node ND21) is changed from 2V to approximately 0.6V based on a parasitic diode of the transistor Q21 or ESD-protection diode D21 (as the time of Vcc1=0V lapses, Vcc2 becomes 0V in either case due to the voltage-dividing resistors R21, R22, however, depending on the time constant, it may take a few seconds). At that time, in the power-ON-clear circuit 10, the potential of the node ND12 is lowered to a negative potential by the potential stored in the capacitor C12, however, due to the parasitic diode of the MOS transistor Q11, it becomes about −0.6V, and a charge of approximately 1.2V is stored in the capacitor C12.

Also, at time T4 when Vcc2 is approximately 0.6 V and the supply of the external power-supply voltage Vcc1 to the semiconductor integrated circuit 100 is restored to Vcc1=3V, the potential at the node ND12 becomes Vcc2−1.2V=0.8V, which is lower than the threshold voltage Vt of the inverter INV11, for example Vt=1.0V, the reset signal RES becomes high level, and the power-ON-clear circuit 10 no longer has a reset period. Therefore, when the supply of the external power-supply voltage Vcc1 to the voltage regulator 20 is temporarily (or instantaneously) stopped, and then that voltage supply is restored, there is a problem in that it is not possible to reset or initialize the internal circuit of the semiconductor integrated circuit 100 using the power-ON-clear circuit 10. By designing the threshold voltage Vt of the inverter INV11 to be low, the power-ON-clear circuit 10 will then have a reset period. However, in that case, the reset period becomes too long, so the operating state is set before resetting or initializing the internal circuit of the semiconductor integrated circuit 100, is completed. This alternative proposal may thus lead to malfunction of the circuit.

Therefore, there is much desired in the art for a semiconductor integrated circuit that has a power-ON-clear circuit having a reset period when restoring the external power-supply voltage Vcc1 after the supply of that voltage to the voltage regulator has temporarily (or instantaneously) stopped.

According to an aspect of the present invention, there is provided a semiconductor integrated circuit that comprises: a voltage regulator that regulates an external power-supply voltage to an internal power-supply voltage, and a power-ON-clear circuit outputting a reset signal when said external power-supply voltage stops temporarily or instantaneously and then that voltage supply is restored.

(2) In the semiconductor integrated circuit described in item (1) above, the power-ON-clear circuit comprises: a MOS transistor that goes ON when the external power-supply voltage is supplied; a capacitor that is connected in series with the MOS transistor and that is charged by the external power-supply voltage by way of the MOS transistor when the external power-supply voltage is supplied; and an inverter that outputs the reset signal when the potential at a connecting point between the MOS transistor and capacitor is input.

(3) In the semiconductor integrated circuit described in item (2) above, the MOS transistor comprises an N-channel transistor, and the capacitor and MOS transistor that is ON form a differentiating circuit.

(4) In the semiconductor integrated circuit described in item (2) above, the MOS transistor comprises a P-channel transistor, and the capacitor and MOS transistor that is ON form an integrating circuit.

(5) In the semiconductor integrated circuit described in item (1) above, the reset signal has a power source voltage level during a reset period.

(6) In the semiconductor integrated circuit described in item (5) above, the power source voltage is a ground voltage.

(7) In the semiconductor integrated circuit described in item (1) above, the reset signal has the internal power supply voltage during a reset period.

(8) According to a second aspect of the present invention, there is provided a semiconductor integrated circuit comprising: a voltage regulator that regulates an external power-supply voltage to an internal power-supply voltage, and a power-ON-clear circuit receiving said internal power-supply voltage and said external power supply voltage to output a reset signal.

(9) In the integrated circuit as described in item (8) above, the power-ON-clear circuit includes a capacitor and a transistor coupled in series between a first power source line receiving the external power supply voltage and a second power source line, and an inverter coupled between an internal power-supply line receiving the internal power-supply voltage and the second power source line and having an input terminal coupled to a connecting point of the capacitor and the transistor.

(10) In the integrated circuit as described in item (9) above, the transistor is inserted between the connecting point and the second power source line and has a control gate coupled to the first power source line.

(11) In the integrated circuit as described in item (9) above, the transistor is inserted between the connecting point and the second power source line and has a control gate coupled to the internal power-supply line.

(12) In the integrated circuit as described in item (9) above, the transistor is inserted between the connecting point and the first power source line and has a control gate coupled to the second power source line.

With the arrangements described above, when the supply of the external power-supply voltage Vcc1 stops, in the power-ON-clear circuit, the voltage stored in the capacitor drops instantaneously to the forward voltage (approximately 0.6V) of a parasitic diode of the MOS transistor, so it is possible for the power-ON-clear circuit to have a reset period, when that voltage supply is restored, by means of the specific arrangements according to the present invention.

The meritorious effects of the present invention are summarized as follows.

With this invention, when the external power-supply voltage Vcc1 that is supplied to the semiconductor integrated circuit stops temporarily (or instantaneously), it is possible to initialize or reset the internal circuits by a reset signal in response to the output level of the voltage regulator of the power-ON-clear circuit when that voltage supply is restored.

PREFERRED EMBODIMENTS OF THE INVENTION

Figure 1:
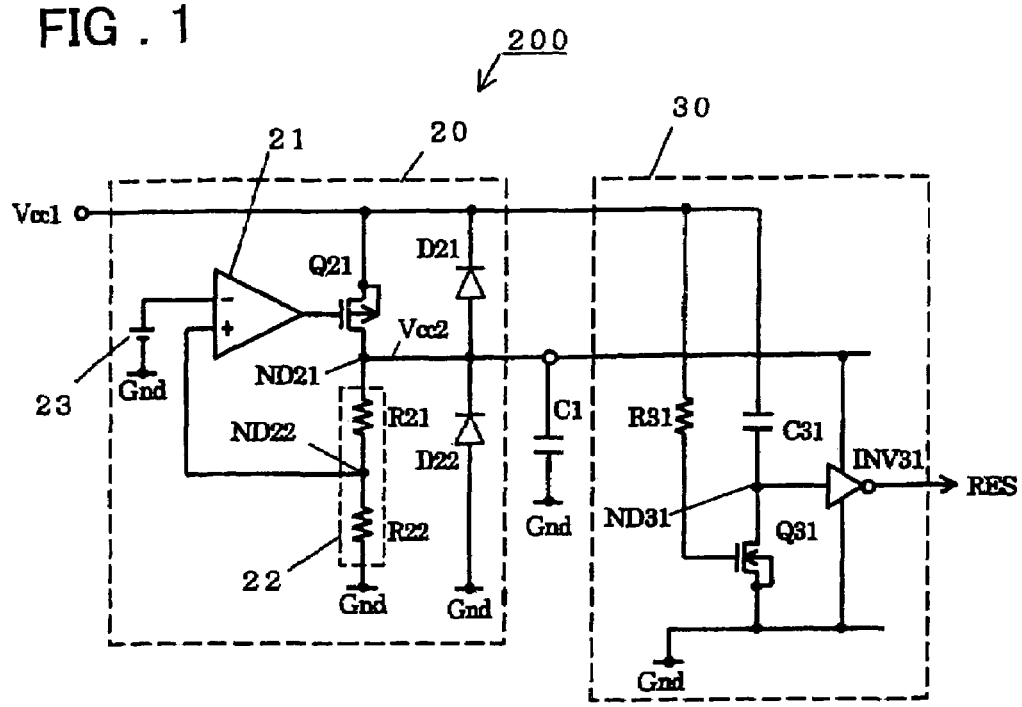
FIG. 1 is a circuit diagram of a semiconductor integrated circuit 200 of a first embodiment of the invention.
Figure 6:
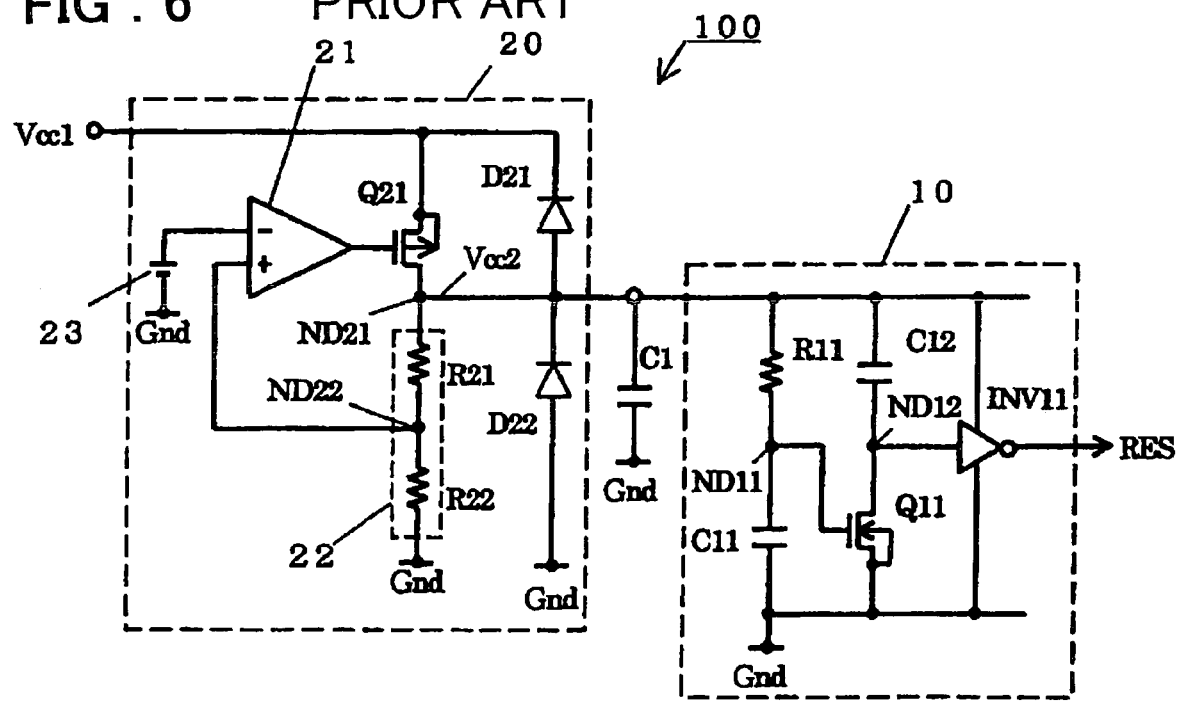
FIG. 6 is a circuit diagram of a semiconductor integrated circuit 100 containing the power-ON-clear circuit 10 shown in FIG. 5.
Figure 7:
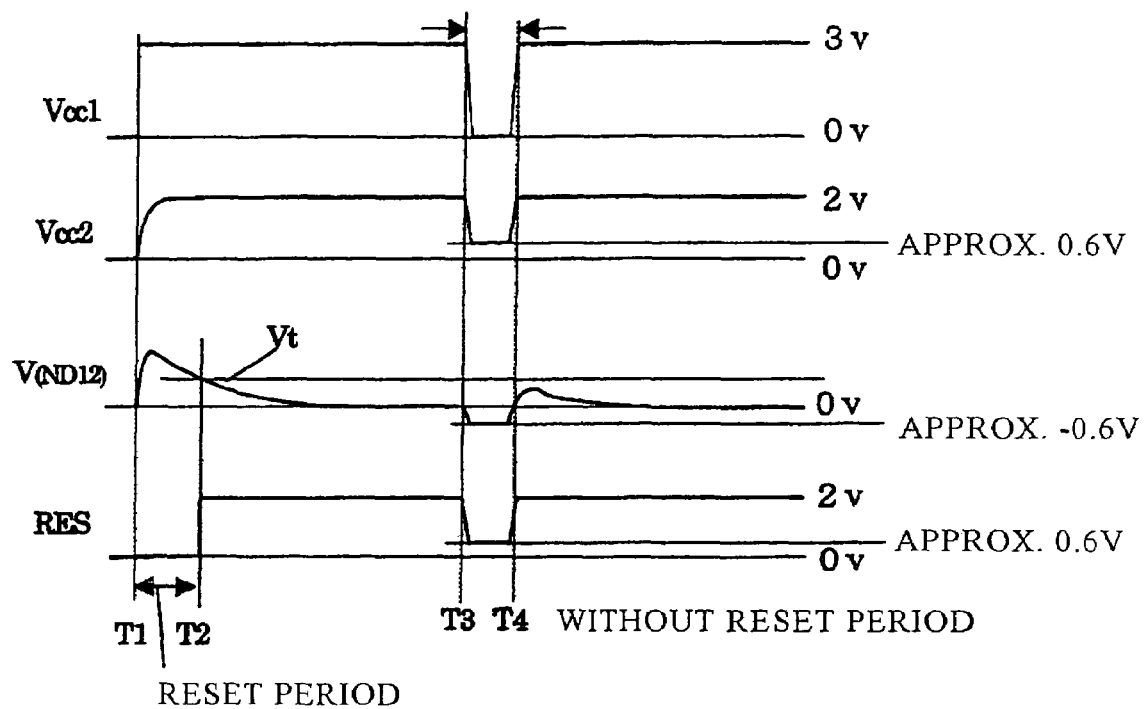
FIG. 7 is a waveform diagram explaining an analyzed operation of the semiconductor integrated circuit 10 shown in FIG. 6.

The semiconductor integrated circuit 200 of a first embodiment of the present invention will be explained below with reference to FIG. 1. The same reference numbers will be assigned to components whose basic construction is the same as those shown in FIG. 6, and an explanation of those components will be omitted by reference to the explanation aforementioned relating to FIG. 6. This semiconductor integrated circuit 200 differs from the semiconductor integrated circuit 100 shown in FIG. 6 in that instead of the power-ON-clear circuit 10, it has a power-ON-clear circuit 30.

The power-ON-clear circuit 30 comprises a resistor R31, a capacitor C31, N-channel MOS transistor Q31 and an inverter INV31. The capacitor C31 and transistor Q31 are connected in series between the external power-supply voltage Vcc1 and the ground potential Gnd. One end of the capacitor C31 is connected to the external power-supply voltage Vcc1, the source of the transistor Q31 is connected to the ground potential Gnd, and the gate of the transistor Q31 is connected to the external power-supply voltage Vcc1 by way of the resistor R31. The gate of the transistor Q31 may be connected to the internal power-supply line Vcc2. The power-supply terminal of the inverter INV31 is connected between the internal power-supply voltage Vcc2 from the voltage regulator 20 and the ground potential Gnd. An input terminal of the inverter INV31 is connected to a connecting point, or in other words, to a node ND31 between the other end of the capacitor C31 and the drain of the transistor Q31. The output signal from the inverter INV31 is output as a reset signal RES to the internal circuit (not shown in the figure) that is connected in a later stage.

Figure 2:
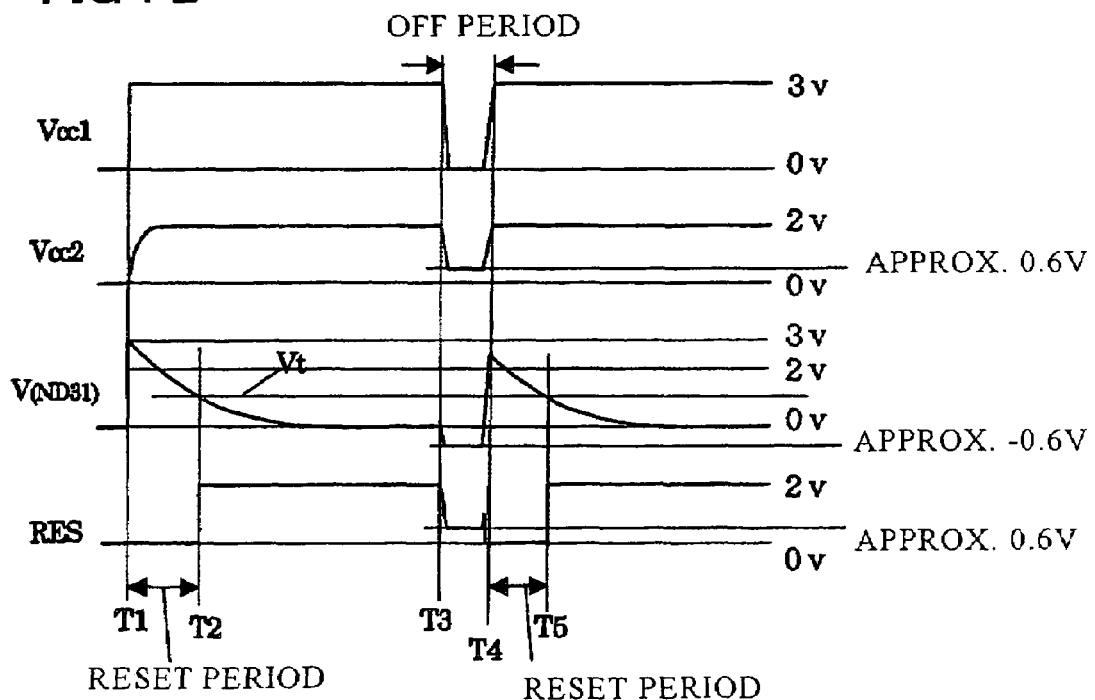
FIG. 2 is a waveform diagram explaining the operation of the semiconductor integrated circuit 200 shown in FIG. 1.

The operation of the semiconductor integrated circuit 200 will be explained with reference to FIG. 2. First, the operation of the power-ON-clear circuit 30 in the semiconductor integrated circuit 200 will be explained for the case when the supply of an external power-supply voltage Vcc1 is performed normally. At time T1, when the external power-supply voltage Vcc1, for example Vcc1=3V, is supplied, that external power-supply voltage Vcc1=3V is supplied to an voltage regulator 20, and the voltage regulator 20 generates an internal power-supply voltage Vcc2, for example Vcc2=2V, and that internal power-supply voltage Vcc2=2V is supplied from a node ND21 of the voltage regulator 20 as a power supply for the inverter INV31 of the power-ON-clear circuit 30.

Moreover, the external power-supply voltage Vcc1=3V is also supplied to the power-ON-clear circuit 30. In the power-ON-clear circuit 30, the external power-supply voltage Vcc1=3V is supplied to the gate of the transistor Q31 via the resistor R31, and is also supplied to one end of the capacitor C31. When the external power-supply voltage Vcc1=3V is supplied to the gate of the transistor Q31, the transistor Q31 is turned ON. Also, after the external power-supply voltage Vcc1=3V is supplied to one end of the capacitor C31, first, the node ND31 is pulled up by the capacitor C31 and it becomes nearly the external power-supply voltage Vcc1=3V. At this time, the reset signal RES from the inverter INV31 becomes low level.

The capacitor C31 and the transistor Q31 that is ON form a differentiating circuit, so the potential at node ND31 drops below Vcc1=3V at a time constant that is set according to the capacitance of the capacitor C31 and the ON resistance of the transistor Q31. At time T2, when the potential at the node ND31 drops below a threshold voltage Vt of the inverter INV31, the reset signal RES from the inverter INV31 changes from low level to high level. Therefore, from time T1 to time T2, the power-ON-clear circuit 30 has a period when the reset signal RES is low level (reset period).

Next, the operation of the power-ON-clear circuit 30 in the semiconductor integrated circuit 200 will be explained for when the supply of the external power-supply voltage Vcc1 stops temporarily (or instantaneously), and then that voltage supply is restored. When the external power-supply voltage Vcc1=3V that is supplied to a semiconductor integrated circuit 200 stops at time T3, that voltage becomes Vcc1=0V, the transistor Q31 goes OFF instantaneously and the potential at the node ND31 becomes approximately −0.6V due to a parasitic diode of the transistor Q31. After the supply of the external power-supply voltage Vcc1 to the semiconductor integrated circuit 200 is restored at time T4, the node ND31 is pulled up by the capacitor C31, and the potential at the node ND31 increases to a value greater than the threshold voltage Vt of the inverter INV31 and becomes nearly the external power-supply voltage Vcc1−0.6=2.4V. After the potential at the node ND31 increases greater than the threshold voltage Vt of the inverter INV31, the reset signal RES from the inverter INV31 becomes low level.

After that, the potential at the node ND31 decreases, and when it decreases below the threshold voltage Vt of the inverter INV31 at time T5, the reset signal RES from the inverter INV31 changes from low level to high level. Therefore, the power-ON-clear circuit 30 has a period (reset period) from time T4 to time T5 when the reset signal RES is at low level.

As described above, the external power-supply voltage Vcc1 is such that when the voltage supply is stopped, the voltage supplied to one end of the capacitor C31 always becomes 0V, and not the internal power-supply voltage Vcc2 from the voltage regulator 20 that never becomes 0V even when the external power-supply voltage Vcc1=0V; and when voltage is supplied, the voltage is the external power-supply voltage Vcc1, which is higher than the internal power-supply voltage Vcc2. Therefore, when the supply of the external power-supply voltage Vcc1 is stopped, the voltage stored by the capacitor C31 instantaneously decreases to approximately 0.6V, and when the supply of that voltage is restored, the potential at the node ND31 gradually increases to a value higher than the threshold voltage Vt of the inverter INV31 and becomes nearly Vcc1−0.6V=2.4V. Therefore, when the external power-supply voltage Vcc1 that is supplied to the semiconductor integrated circuit 200 stops temporarily (or instantaneously), the power-ON-clear circuit 30 can have a reset period even when the supply of that voltage is restored.

Figure 3:
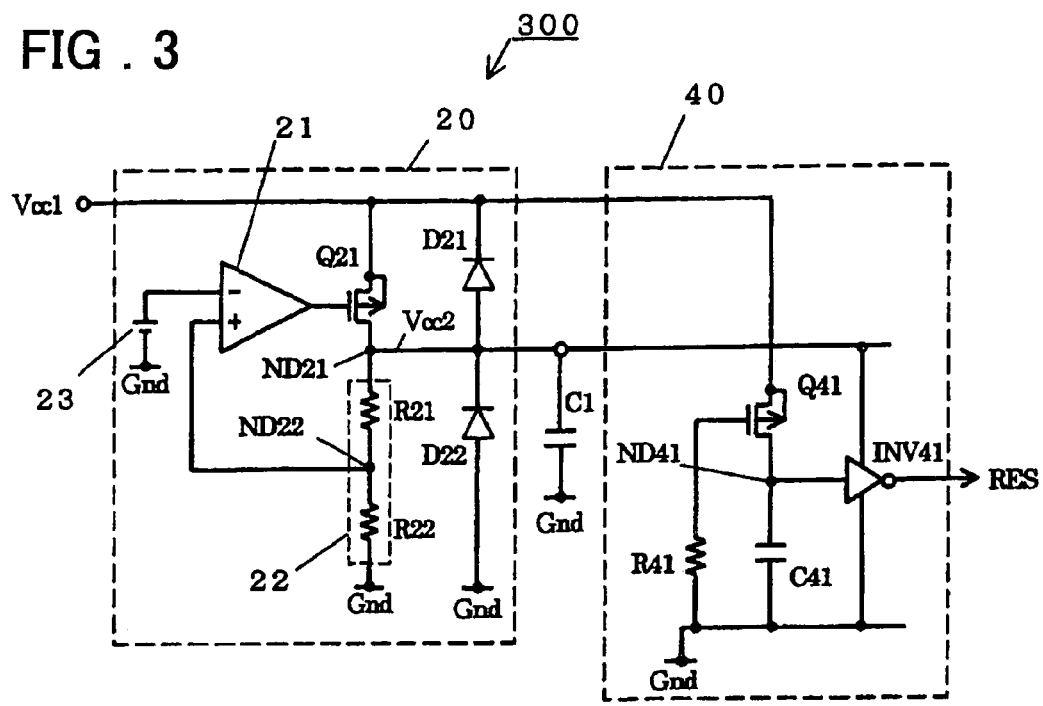
FIG. 3 is a circuit diagram of a semiconductor integrated circuit 300 of a second embodiment of the invention.

Next, the semiconductor integrated circuit 300 of a second embodiment of the present invention will be explained with reference to FIG. 3. Parts that have basically the same construction as those shown in FIG. 1 will be given the same reference numbers, and an explanation of those parts will be omitted. The semiconductor integrated circuit 300 of this embodiment differs from the semiconductor integrated circuit 200 shown in FIG. 1 in that it has a power-ON-clear circuit 40 instead of the power-ON-clear circuit 30.

The power-ON-clear circuit 40 comprises a resistor R41, a capacitor C41, a P-channel MOS transistor Q41 and an inverter INV41. The transistor Q41 and capacitor C41 are connected in series between the external power-supply voltage Vcc1 and the ground potential Gnd. The source of the transistor Q41 is connected to the external power-supply voltage Vcc1, one end of the capacitor C41 is connected to the ground potential Gnd, and the gate of the transistor Q41 is connected to the ground potential Gnd via the resistor R41. The power-supply terminal of the inverter INV41 is connected between the internal power-supply voltage Vcc2 from the voltage regulator 20 and the ground potential Gnd. The input terminal of the inverter INV41 is connected to a connecting point, or in other words, to a node ND41 between the drain of the transistor Q41 and the other end of the capacitor C41. The output signal from the inverter INV41 is output as a reset signal RES to the internal circuit (not shown in the figure) that is connected at a later stage.

Figure 4:
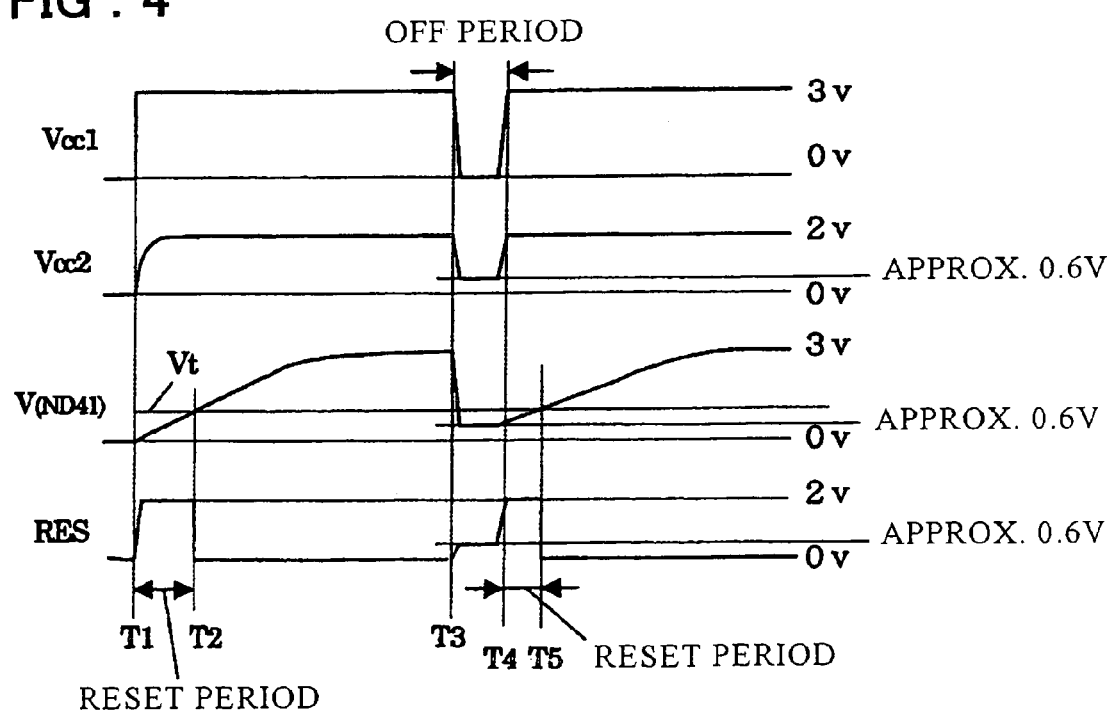
FIG. 4 is a waveform diagram explaining the operation of the semiconductor integrated circuit 300 shown in FIG. 3.
Figure 5:
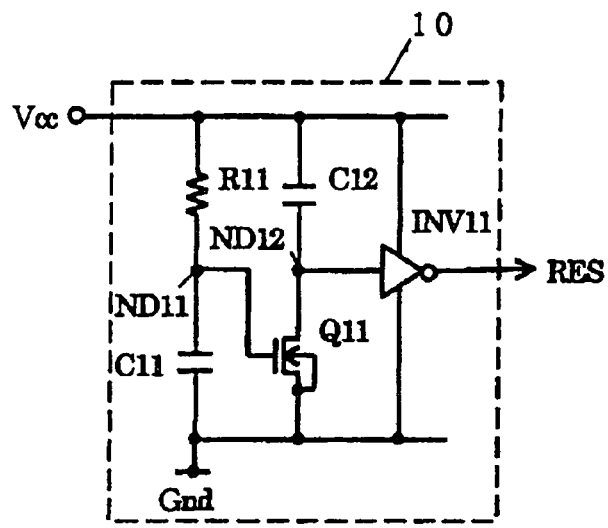
FIG. 5 is a circuit diagram of an example of a conventional power-ON-clear circuit 10.

The operation of the semiconductor integrated circuit 300 will be explained with reference to FIG. 4. First, the operation of the power-ON-clear circuit 40 in the semiconductor integrated circuit 300 when the external power-supply voltage Vcc1 is supplied normally will be explained. At time T1, when the external power-supply voltage Vcc1, for example Vcc1=3V is supplied, this external power-supply voltage Vcc1=3V is supplied to the voltage regulator 20, and the voltage regulator 20 generates an internal power-supply voltage Vcc2, for example Vcc2=2V, and this internal power-supply voltage Vcc2=2V is supplied from the node ND21 of the voltage regulator 20 as the power supply for the inverter INV41 of the power-ON-clear circuit 40. At this time, the potential at the node ND41 is low level, and the reset signal RES from the inverter INV41 becomes high level.

That external power-supply voltage Vcc1=3V is also supplied to the power-ON-clear circuit 40. In the power-ON-clear circuit 40, the gate of the transistor Q41 is connected to the ground potential Gnd, and when the external power-supply voltage Vcc1=3 is supplied to the source of the transistor Q41, the capacitor C41 is charged via the transistor Q41 that has been turned ON. The transistor Q41 that is at ON and the capacitor C41 form an integrating circuit, so after that, the potential at the node ND41 increases to the voltage Vcc1=3V at a time constant defined by the ON resistance of the transistor Q41 and the capacitance of the capacitor C41. After the potential at the node ND41 increases to a value greater than the threshold voltage Vt of the inverter INV41 at time T2, the reset signal RES from the inverter INV41 switches from high level to low level. Therefore, the power-ON-clear circuit 40 has a period (reset period) from time T1 to time T2 when the reset signal RES is at high level.

Next, the operation of the power-ON-clear circuit 40 in the semiconductor integrated circuit 300 will be explained for when the supply of the external power-supply voltage Vcc1 stops temporarily (or instantaneously), and then that voltage supply is restored. At time T3 when the external power-supply voltage Vcc1=3V that is supplied to the semiconductor integrated circuit 300 stops and the voltage becomes Vcc1=0V, the transistor Q41 goes OFF instantaneously, and the potential at the node ND41 becomes approximately 0.6V due to a parasitic diode of the transistor Q41. Also, after the supply of the external power-supply voltage Vcc1=3V to the semiconductor integrated circuit 300 is restored at time T4, an internal power-supply voltage Vcc2=2V is supplied from the node ND21 of the voltage regulator 20 as the power supply for the inverter INV41 of the power-ON-clear circuit 40. At this time, the potential at the node ND41 is approximately 0.6V, which is lower than the threshold voltage Vt of the inverter INV41, and the reset signal RES from the inverter INV41 becomes high level.

After that, the potential at the node ND41 gradually increases to Vcc1=3V. At time T5, when the potential at the node ND41 increases to the threshold voltage Vt of the inverter INV41, the reset signal RES from the inverter INV41 changes from high level to low level. Therefore, the power-ON-clear circuit 40 has a period (reset period) from time T4 to time T5 when the reset signal RES is at high level.

As described above, the external power-supply voltage Vcc1 is such that upon stopping of the voltage supply, the voltage supplied to the source of the transistor Q41 always becomes 0V, and not the internal power-supply voltage Vcc2 from the voltage regulator 20 that never becomes 0V even when the external power-supply voltage Vcc1 is 0V. Therefore, when the supply of the external power-supply voltage Vcc1 is stopped, the voltage stored by the capacitor C41 instantaneously decreases to approximately 0.6V, and when the supply of that voltage is restored, the potential at the node ND41 gradually increases from approximately 0.6V, which is lower than the threshold voltage Vt of the inverter INV41, to the external power-supply voltage Vcc1, which is higher than the threshold voltage Vt of the inverter INV41. Therefore, when the external power-supply voltage Vcc1 that is supplied to the semiconductor integrated circuit 300 stops temporarily (or instantaneously), the power-ON-clear circuit 40 can have a reset period even when the supply of that voltage is restored.

In each of the embodiments described above, the inverter was explained as having one stage, however, it can also be constructed such that it has a plurality of an odd number of stages. Also, in the first embodiment, the period when the reset signal RES from the power-ON-clear circuit was low level was explained as being the reset period, and in the second embodiment, the period when the reset signal RES from the power-ON-clear circuit was high level was explained as being the reset period, however, in the case where the inverter is constructed having an even number of stages, reset periods having the opposite levels are possible.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor integrated circuit comprising:
a voltage regulator that outputs an external power-supply voltage and an internal power-supply voltage lower than the external power-supply voltage; and
a power-ON-clear circuit comprising,
an inverter with a power-supply terminal connected to the internal power-supply voltage and an input terminal receiving the external power-supply voltage, said inverter outputting a reset signal each time immediately after said external power-supply voltage is interrupted and restored, and
a MOS transistor and a capacitor that are connected in series between said external power-supply voltage and a ground potential, a connecting point between said MOS transistor and said capacitor being connected to said input terminal of said inverter,
said MOS transistor having terminals connected to said external power-supply voltage and the ground potential and is turned ON when said external power-supply voltage is supplied, and
said capacitor having a terminal connected to one of the external power-supply voltage and the ground potential and is charged by said external power-supply voltage when said external power-supply voltage is supplied.

2. The semiconductor integrated circuit of claim 1, wherein said MOS transistor comprises an N-channel transistor, and
said capacitor and said MOS transistor that is ON form a differentiating circuit.

3. The semiconductor integrated circuit of claim 1, wherein said MOS transistor comprises a P-channel transistor, and said capacitor and MOS transistor that is ON form an integrating circuit.

4. The integrated circuit as claimed in claim 1, wherein said reset signal has a power source voltage level during a reset period.

5. The integrated circuit as claimed in claim 4, wherein said power source voltage is a ground voltage.

6. The integrated circuit as claimed in claim 1, wherein said reset signal has said internal power supply voltage during a reset period.

* * * * *